Figure 1:
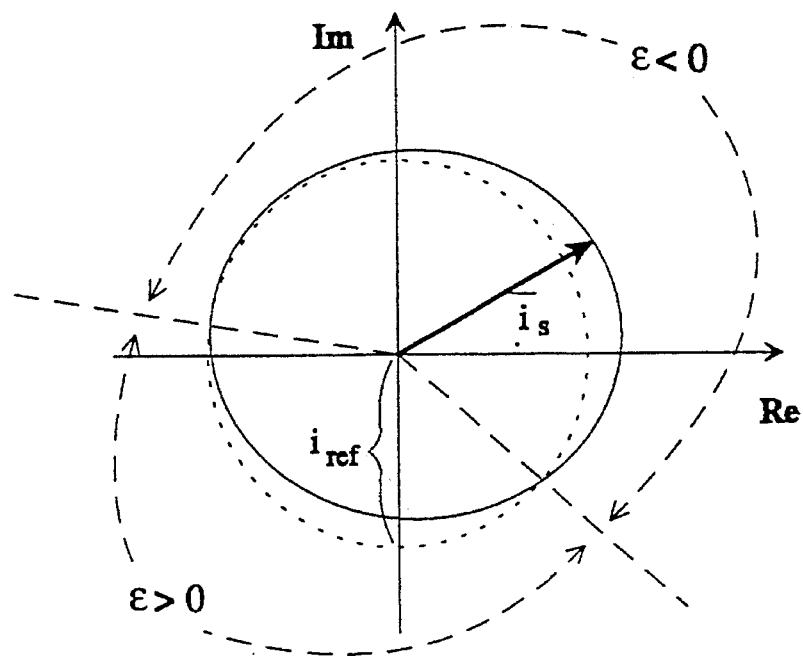

United States Patent [19]
Heikkilä

[11] Patent Number: 5,589,754
[45] Date of Patent: Dec. 31, 1996

[54] METHOD FOR DETERMINING A STATOR FLUX ESTIMATE FOR AN ASYNCHRONOUS MACHINE

[75] Inventor: Samuli Heikkilä, Helsinki, Finland

[73] Assignee: ABB Industry Oy, Helsinki, Finland

[21] Appl. No.: 507,413

[22] PCT Filed: Feb. 24, 1994

[86] PCT No.: PCT/FI94/00071

§ 371 Date: Aug. 24, 1995

§ 102(e) Date: Aug. 24, 1995

[87] PCT Pub. No.: WO94/22213

PCT Pub. Date: Sep. 29, 1994

[30] Foreign Application Priority Data

Mar. 17, 1993 [FI] Finland ..................... 931186

[51] Int. Cl.⁶ .................................................. H02P 5/28
[52] U.S. Cl. ............................................. 318/805; 318/808
[58] Field of Search .................................. 318/800, 802, 318/803, 804, 805, 806, 807, 808, 809, 810, 811, 727, 798

[56] References Cited

U.S. PATENT DOCUMENTS

| | | | |
|---|---|---|---|
| 4,441,065 | 4/1984 | Bayer et al. | 318/808 |
| 4,447,787 | 5/1984 | Schwesig et al. | 318/803 |
| 5,194,797 | 3/1993 | Kahkipuro | 318/803 |
| 5,371,548 | 12/1994 | Heikkila | 318/802 |

*Primary Examiner*—John W. Cabeca
*Attorney, Agent, or Firm*—Watson Cole Stevens Davis, PLLC

[57] ABSTRACT

Apparatus for determining an estimate for the stator flux of an asynchronous machine when the supply frequency $\omega_s$, stator inductance $L_s$, at least one of stator resistance $R_s$ and an estimate $R_{se}$ therefor, and short-circuit inductance $\sigma L_s$ are known, is carried out by structure for measuring the stator current $\bar{i}_s$ and stator voltage $\bar{u}_s$, calculating a difference voltage by subtracting at least one of the product of the stator resistance and the estimate thereof and the stator current from the stator voltage, integrating the difference voltage in relation to time to give a stator flux estimate $\bar{\psi}_{se}$, subtracting, prior to integrating a correction term based on the feedback stator flux estimate $\bar{\psi}_{se}$ and being proportional to the product of the difference variable and the direction vector $\bar{C}$ given therefor, from the difference voltage, determining the difference variable from the equation:

$$(\bar{\psi}_{se} - L_s \bar{i}_s) \cdot (\bar{\psi}_{se} - \sigma L_s \bar{i}_s) = \epsilon \text{ and}$$

forming the direction vector $\bar{C}$ from the feedback stator flux estimate $\bar{\psi}_{se}$ by turning it for the angle $\theta$ which is dependent on the operational mode of the machine.

10 Claims, 3 Drawing Sheets

METHOD FOR DETERMINING A STATOR FLUX ESTIMATE FOR AN ASYNCHRONOUS MACHINE

The present invention relates to a method for determining an estimate for the stator flux of an asynchronous machine when the stator current, stator voltage, supply frequency, stator inductance, stator resistance or an estimate therefor, and short-circuit inductance of the machine are known. A stator resistance estimate for the machine can also be determined by the method.

In frequency converter-based control of an asynchronous machine, the object is often to make the torque generated by the machine to behave in a desired way when the current and voltage supplied to the machine are known. In that situation, one attempts to influence the electric torque, which in terms of the stator flux and stator current is:

$$T_m = k(\overline{\psi}_s \times \overline{i}_s) \quad (1)$$

where $T_m$=electric torque,
k=constant coefficient,
$\overline{\psi}$=stator flux, and
$\overline{i}_s$=stator current.

Controlled torque regulation therefore requires that besides the current $\overline{i}_s$, the stator flux or a commensurate variable (such as the rotor flux or air gap flux) of the machine is known. This will not present any problem with operation at high frequencies, in which situation integration of the voltage supplied to the machine is known to give a good estimate for the stator flux:

$$\overline{\psi}_s = \int \overline{u}_s dt = \frac{\overline{u}_s}{j\omega_s}, \quad (2)$$

where $\overline{u}_s$=stator voltage, and
$\omega_s$=supply frequency.

$\overline{\psi}_s$ is easy to calculate from equation 2 when the supply voltage and its frequency are known.

It can also be seen from this equation that when $\omega_s$ diminishes below a specific nominal frequency the voltage must be reduced in order for the flux not to increase too much and the machine not to become saturated.

Yet equation 2 is not practicable with low frequencies, since in reality the voltage to which the windings of the machine are subjected deviates from the supply voltage to the extent of the voltage loss developed in the winding resistances. Thus the relative proportion of the loss component in the voltage increases when $\overline{u}_s$ has to be reduced as $\omega_s$ diminishes. With low frequencies the loss component should thus be taken into account, i.e., the flux estimate should be calculated from the equation:

$$\overline{\psi}_s = \int (\overline{u}_s - R_s \overline{i}_s) dt, \quad (3)$$

where $R_s$=stator resistance.

The accuracy of the flux estimate calculated by means of this equation is, however, strongly dependent on the accuracy of the $R_s$ estimate employed and on the operating frequency, such that the error in the steady slate of the flux estimate increases in direct proportion to the error in the $R_s$ estimate and in inverse proportion to the frequency. On the other hand, the $R_s$ estimate must always be distinctly smaller than the actual stator resistance to enable stable control by the integrating method according to equation 3. Therefore, with the mere integrating method one can in practice hardly attain frequencies below 10 Hz without a significant steady state error in the flux estimate.

This problem related to the integrating method can be solved with the use of either direct or indirect vector control. In the first case, the stator flux is measured directly with a measuring element incorporated in the machine, whereas in the latter method it is calculated indirectly on the basis of the stator current and speed information obtained from a tachometer disposed on the shaft of the machine. In both cases, the torque of the machine can also be controlled at zero frequency, but bot methods require an extra measuring element which is relatively costly and diminishes reliability.

The above problems can be avoided without any need for extra measuring elements incorporated in the machine by using the method of the present invention. In this method, the stator flux estimate is calculated by means of equation 3 in such a way that corrections are made in the voltage estimate to be integrated, allowing compensation of errors in the flux estimate produced in the integration. The corrections of the voltage estimate are selected depending on the supply frequency and torque in such a way that on account of said corrections the stator current is set at a reference current value that the stator current should have in a steady state, if the machine had a stator flux of the magnitude of the flux estimate and a torque of the magnitude of the torque estimate, calculated from the flux estimate and the measured stator current. In connection with the calculation of the voltage estimate corrections, an estimate for the stator resistance can also be determined if it is not otherwise known. This stator resistance estimate is needed for calculation of the voltage estimate. The supply frequency, stator inductance and short-circuit inductance needed to calculate the corrections are presumed to be known. The invention is thus mainly characterized by that which is set forth in the appended claim 1.

Figure 2:
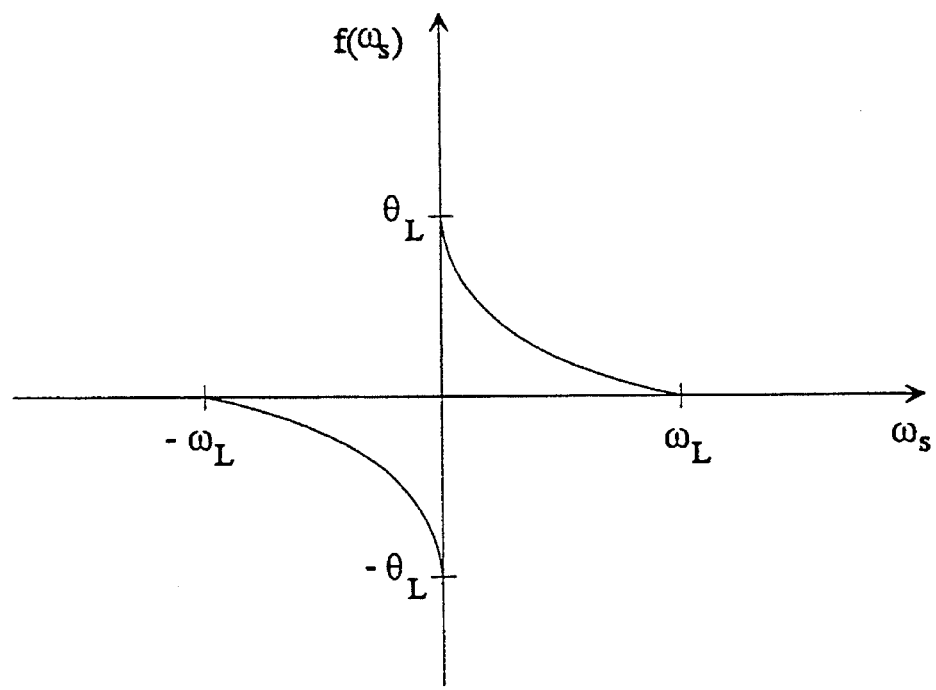
Figure 3A:
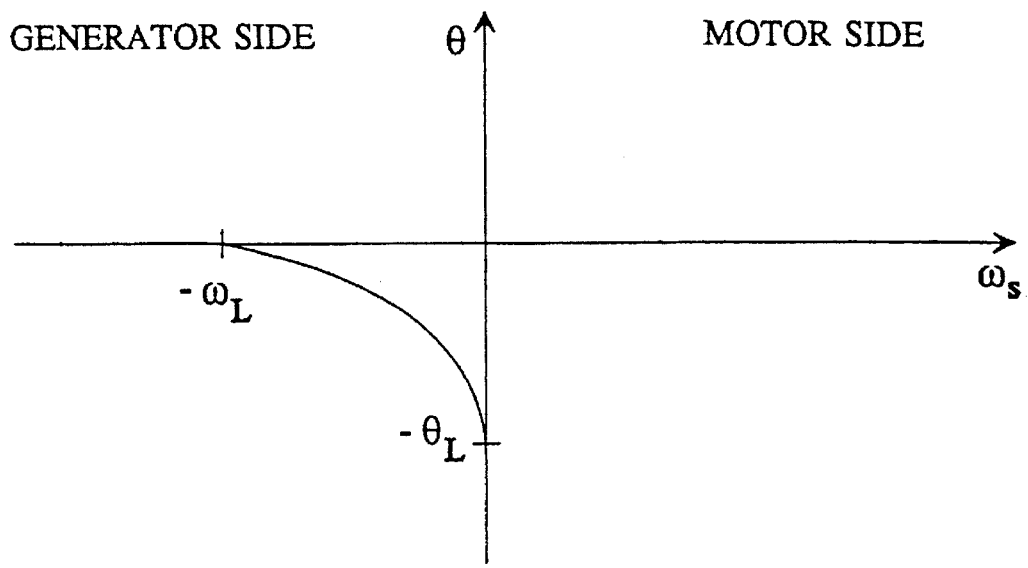
Figure 3B:
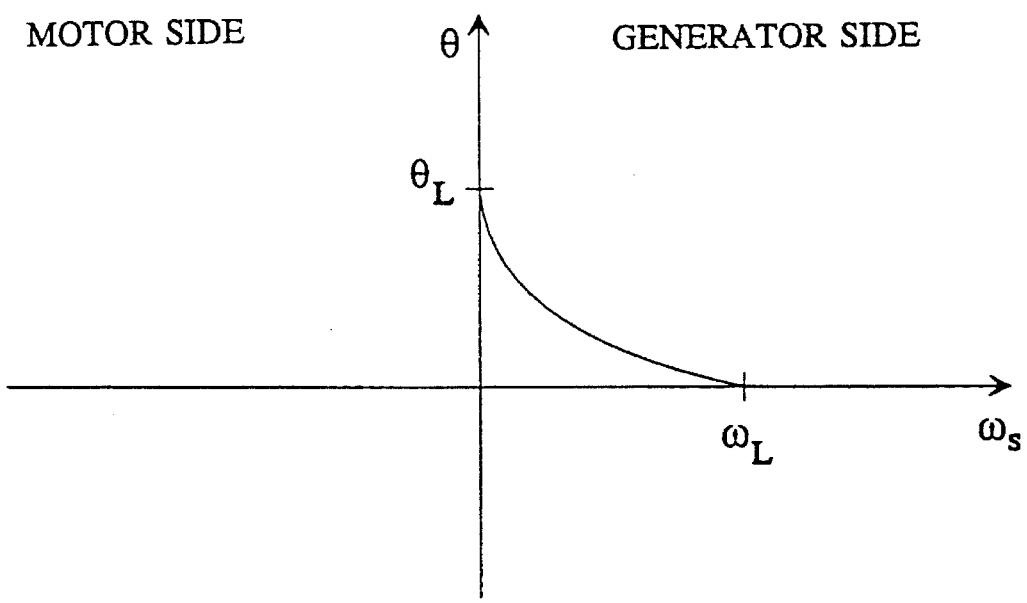
Figure 4:
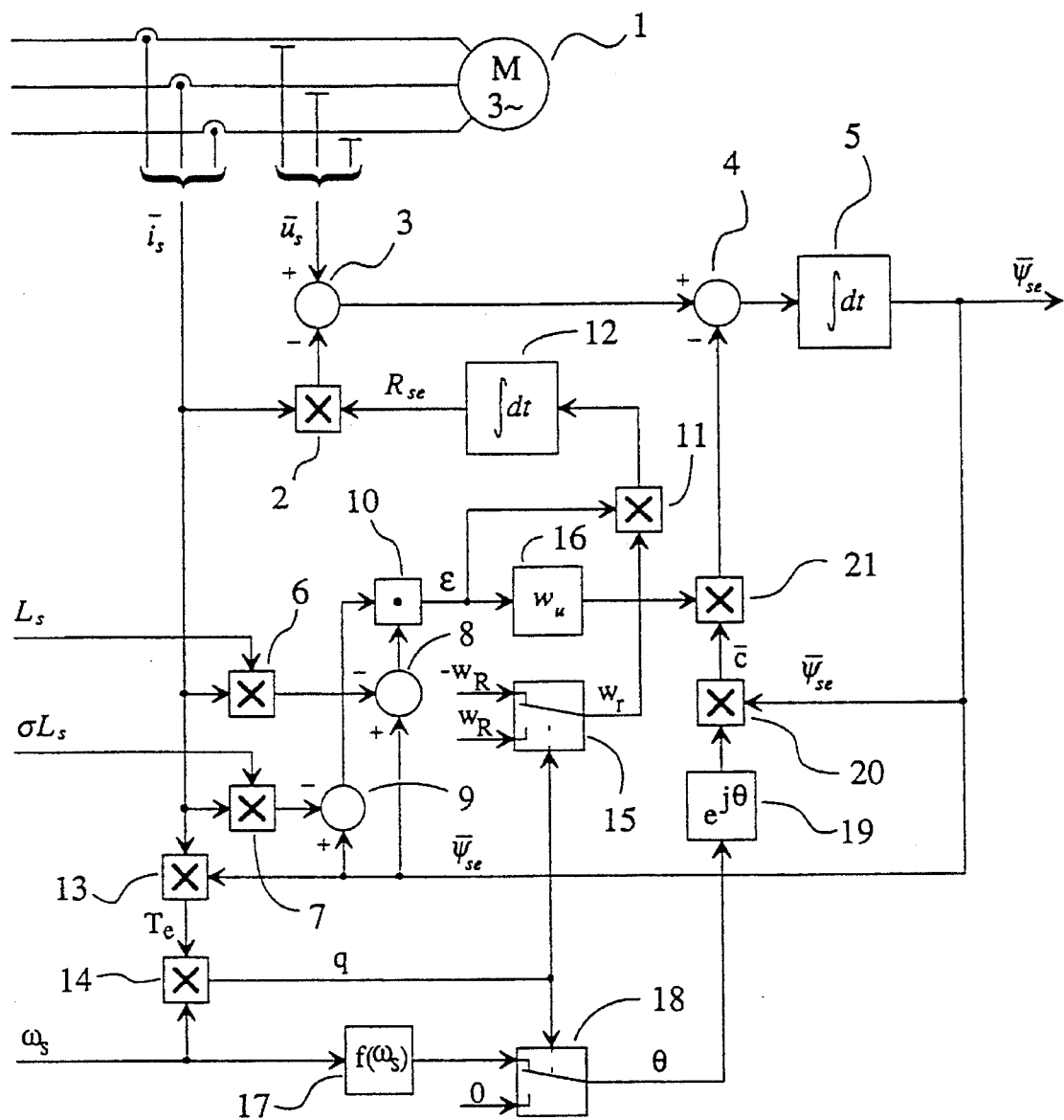

In the following the invention will be set forth in greater detail with reference to the accompanying drawings, in which FIG. 1 shows an example of a stator current vector as a function of time, and the dependence of the difference variable ε on the stator current and reference current, FIG. 2 shows an example of function f as a function of the supply frequency, FIGS. 3a and 3b show examples of angle θ as a function of the supply frequency when the torque is a) positive and b) negative, and FIG. 4 shows a method of the invention for calculating the stator flux of an asynchronous machine.

For deduction of the expression for the reference current, let us first look at certain known basic equations for the steady state in an asynchronous machine in stator coordinates:

$$0 = R_r \overline{i}_r + j\omega_r \overline{\psi}_r \quad (4)$$

$$\overline{\psi}_s = L_s \overline{i}_s + L_m \overline{i}_r \quad (5)$$

$$\overline{\psi}_r = L_r \overline{i}_r + L_m \overline{i}_s, \quad (6)$$

where $\overline{\psi}_r$=rotor flux,
$\overline{i}_r$=rotor current,
$\omega_r$=slip frequency,
$R_r$=rotor resistance,
$L_s$=stator inductance,
$L_r$=rotor inductance, and
$L_m$=main inductance.

Employing equations 5 and 6, the rotor flux and rotor current can be expressed by means of the stator flux and stator current:

$$\bar{\psi}_r = \frac{L_r}{L_m}(\bar{\psi}_s - \sigma L_s \bar{i}_s) \qquad (7)$$

$$\bar{i}_r = \frac{1}{L_m}(\bar{\psi}_s - L_s \bar{i}_s), \qquad (8)$$

where $\sigma = 1 - \frac{L_m^2}{L_s L_r}$ = dispersion coefficient, and $\sigma L_s$ = short-circuit inductance.

It follows from equation 4 that $$R_r \bar{i}_r = -j\omega_r \bar{\psi}_r \qquad (9)$$

In other words, the rotor current in steady state is perpendicular to the rotor flux, and thus the notation is:

$$\bar{i}_r \cdot \bar{\psi}_r = 0, \qquad (10)$$

where "·"=scalar product.

By inserting equations 7 and 8 in equation 10 we have $$(\bar{\psi}_s - L_s \bar{i}_s) \cdot (\bar{\psi}_s - \sigma L_s \bar{i}_s) = 0 \qquad (11)$$

An incorrect stator flux estimate will not normally satisfy equation 11, and thus the magnitude of the error in the flux estimate may be denoted by difference variable $\epsilon$, which is determined as follows:

$$(\bar{\psi}_{se} - L_s \bar{i}_s) \cdot (\bar{\psi}_{se} - \sigma L_s \bar{i}_s) = \epsilon \qquad (12)$$

$$\Leftrightarrow$$

$$\psi_{se}^2 - (L_s + \sigma L_s)\bar{\psi}_{se} \cdot \bar{i}_s + L_s \sigma L_s i_s^2 = \epsilon, \qquad (13)$$

where $\bar{\psi}_{se}$ is the stator flux estimate.

As a next step, the electric torque $T_e$ is determined in such a way that $$T_e = \bar{\psi}_{se} \times \bar{i}_s = \psi_{se} i_{sq}, \qquad (14)$$

where $i_{sq}$ is the perpendicular component of the stator current relative to the stator flux estimate.

Now, the scalar product of the flux and current in equation 13 may be written as $$\bar{\psi}_{se} \cdot \bar{i}_s = \psi_{se} i_{sd} = \psi_{se}\sqrt{i_s^2 - i_{sq}^2} = \sqrt{\psi_{se}^2 i_s^2 - T_e^2}, \qquad (15)$$

where $i_{sd}$ is the component of the stator current having the direction of the stator flux estimate.

Inserting equation 15 in equation 13 gives the following dependence between the flux and torque estimates and the square of the stator current:

$$\psi_{se}^2 - (L_s + \sigma L_s)\sqrt{\psi_{se}^2 i_s^2 - T_e^2} + L_s \sigma L_s i_s^2 = \epsilon \qquad (16)$$

The aim is to correct the stator flux estimate such that $\epsilon$ is zeroed in equation 16. In that situation, the absolute value of the stator current approaches the reference value $i_{ref}$ which satisfies the equation:

$$\psi_{se}^2 - (L_s + \sigma L_s)\sqrt{\psi_{se}^2 i_{ref}^2 - T_e^2} + L_s \sigma L_s i_{ref}^2 = 0 \qquad (17)$$

where $i_{ref}$ represents the current the value of which the absolute value of the stator current vector should have in the steady state if the machine had a stator flux of $\psi_{se}$ and a torque of $T_e$.

Thus the square of the reference current obtained from equation 17 as a function of the flux and torque estimates is:

$$i_{ref}^2 = \frac{1}{2}\left[\left(\frac{1}{\sigma_2 L_s^2} + \frac{1}{L_s^2}\right)\psi_{se}^2 - \left(\frac{1}{\sigma^2 L_s^2} - \frac{1}{L_s^2}\right)\sqrt{\psi_{se}^4 - \frac{4\sigma^2 L_s^4}{(L_s - \sigma L_s)^2}T_e^2}\right] \qquad (18)$$

However, calculating the reference current from the statement of equation 18 is rather cumbersome and also unnecessary, as it can be shown that $$\begin{cases} \epsilon \geq 0 & \text{when } i_s^2 \leq i_{ref}^2 \\ \epsilon < 0 & \text{when } i_s^2 > i_{ref}^2 \end{cases} \qquad (19)$$

In other words, the difference variable $\epsilon$ calculated in equation 12 is positive if the amplitude of the stator current is lower than the reference current, and vice versa. This dependence has been illustrated in FIG. 1. Thus, using the difference variable it is possible to correct the flux estimate such that the stator current will be equal in amplitude to the reference current.

In the present invention the correction of the flux estimate is performed indirectly in such a way that first a correction term proportional to $\epsilon$ is subtracted from the voltage estimate, wherefrom the flux estimate is subsequently calculated by integration, i.e. (cf. equation 3):

$$\bar{\psi}_{se} = \int(\bar{u}_s - R_{se}\bar{i}_s - \epsilon w_u \bar{c})dt, \qquad (20)$$

where $\epsilon w_u \bar{c}$=correction term for voltage estimate $w_u$=amplification coefficient (>0) for correction of voltage estimate, and $\bar{c}$=direction vector for correction of voltage estimate.

Coefficient $w_u$ has bearing on how close to the reference current the measured current is set. The higher the value of $w_u$, the closer the current will be to the reference and the smaller $\epsilon$ will also be, in other words, $w_u$ is comparable to the P factor in a conventional controller. It should preferably be selected to be as high as possible in order for the noise in $\epsilon$ not to have too much influence on the flux estimate.

The direction vector $\bar{c}$ is selected so as to form a predetermined angle $\theta$ relative to the flux estimate:

$$\bar{c} = e^{j\theta}\bar{\psi}_{se} \qquad (21)$$

In order for the control based on the present method to be stable, the direction $\theta$ of correction of the voltage estimate should be selected as follows:

$$\theta = \begin{cases} 0 & \text{when } q \geq 0 \\ f(\omega_s) & \text{when } q < 0 \end{cases}, \qquad (22)$$

where $$q = \omega_s T_e \begin{cases} >0 & \text{on motor side} \\ =0 & \text{with no load, zero frequency} \\ <0 & \text{on generator side} \end{cases} \qquad (23)$$

and $f(\omega_s)$=odd function as shown in FIG. 2. This receives the value zero when the absolute value of the frequency exceeds a predetermined threshold frequency $\omega_L$. It is piecewise monotonic decreasing in the range $-\omega_L \ldots \omega_L$, receiving its minimum and maximum values $-\theta_L$ and $\theta_L$ at zero frequency. $\omega_L$ and $\theta_L$ are machine-dependent to some extent, so that $\omega_L$ is 10% ... 20% from the nominal frequency and $\theta_L$ is 50° ... 80°.

Thus the direction of correction of the voltage estimate is dependent on the frequency and torque existing in the machine as shown in FIGS. 3a and 3b. When the torque is positive, which situation is illustrated in FIG. 3a, with positive frequencies the machine serves as a motor, and in that case the voltage estimate is only corrected in the direction of the flux estimate ($\theta=0$). On the generator side above the threshold frequency $-\omega_L$ said angle is turned as a function of the frequency in the negative direction, so that the angle $-\theta_L$ is achieved with zero frequency. Respectively with a negative torque, which situation is illustrated in FIG. 3b, the machine serves as a motor when the frequency is negative, and in that case $\theta=0$. With a positive frequency one operates on the generator side, in which case the angle is reduced as a function of the frequency starting from the value $\theta_L$, so that above the threshold frequency $\omega_L$, $\theta=0$.

In the calculation of the estimate $R_{se}$ for the stator resistance employed in equation 20, one makes use of the finding that a lower estimate than the actual stator resistance will cause an error in the flux calculated by the integrating method (equation 3), which will result in too low a stator current in a no-load situation and on the motor side, and too high a stator current on the generator side. Respectively, a higher $R_{se}$ than actual causes a reverse error in the stator current. By adding to the integrating method a term correcting the stator voltage estimate (equation 20), the effect of $R_{se}$ on the stator current can be considerably diminished, but also in that case it has a small effect of a similar direction on the current and thereby also on the difference variable $\epsilon$, so that on the motor side:

$$\begin{cases} \epsilon > 0 & \text{when } R_{se} < R_s \\ \epsilon < 0 & \text{when } R_{se} > R_s \end{cases} \quad (24)$$

and on the generator side:

$$\begin{cases} \epsilon > 0 & \text{when } R_{se} > R_s \\ \epsilon < 0 & \text{when } R_{se} < R_s \end{cases} \quad (25)$$

Therefore, it is possible to adjust $R_{se}$ by means of the difference variable $\epsilon$ and equations 24 and 25 to equal the actual stator resistance. Thus in the present invention $R_{se}$ is calculated as follows:

$$R_{se} = \int (w_r \epsilon) dt, \quad (26)$$

where $$w_r = \begin{cases} w_r & \text{when } q \geq 0 \\ -w_R & \text{when } q < 0 \end{cases} \quad (27)$$

and $w_R$ is a positive constant.

The estimate for the stator resistance is thus obtained by integrating the difference variable $\epsilon$ weighted by coefficient $w_r$ (equation 26). In accordance with equation 27, $w_r$ is selected in a no-load situation and on the motor side ($q \geq 0$) to equal the constant $w_R$ and on the generator side ($q < 0$) to equal the constant $-w_R$, in consequence of which $R_{se}$ increases on the motor side and diminishes on the generator side with a positive $\epsilon$ value. The coefficient $w_R$ determines how fast $R_{se}$ follows variations in the actual stator resistance which are mainly due to variations in the temperature of the stator of the machine dependent on load variations. In practice, $w_R$ should preferably be selected to be rather small, since the actual $R_s$ can only change very slowly.

With correction of $R_{se}$, one achieves setting of the current vector in steady state at its reference value ($\epsilon=0$). The greater $w_R$, the faster the setting is; yet too high $w_R$ will cause instability. $w_R$ is comparable to the I factor in a conventional controller.

The method of the invention is illustrated as a flow chart in FIG. 4. The input variables are the measured stator current $\bar{i}_s$ and stator voltage $\bar{u}_s$ of the asynchronous machine 1. Furthermore, the stator inductance $L_s$, short-circuit inductance $\sigma L_s$ and supply frequency $\omega_s$ are presumed to be known. The method gives as an output variable an estimate $\bar{\psi}_{se}$ for the stator flux of the machine, in addition to which an estimate $R_{se}$ for the stator resistance is also calculated in the method.

Calculation of the stator flux estimate employs equation 20, according to which first in block 3 the product of the estimates of the stator current and stator resistance calculated in block 2 is subtracted from the stator voltage $\bar{u}_s$. Block 4 subtracts the correction term $\epsilon w_u \bar{c}$ from the voltage estimate $\bar{u}_s - R_{se}\bar{i}_s$ obtained as an output from block 3, and the resultant difference is further integrated in block 5 to obtain a stator flux estimate $\bar{\psi}_{se}$.

The stator resistance estimate $R_{se}$ is calculated on the basis of equation 26 by integrating in block 12 the product of the difference variable $\epsilon$ and a weighting factor $w_r$, which has been calculated in block 11. The weighting factor $w_r$ is given by the selector of block 15, whose output receives the value $w_R$ if $q \geq 0$, or the value $-w_R$ if $q<0$ (equation 27).

To determine the correction term $\epsilon w_u \bar{c}$ for the voltage estimate, angle $\theta$ is first formed in block 18, the selector of which gives as an output either zero if $q \geq 0$, or a function $f(\omega_s)$ of the supply frequency $\omega_s$ calculated in block 17 (FIG. 2) if $q<0$, in accordance with equation 22. From angle $\theta$ a unit vector $e^{j\theta}$ is formed in block 19; the unit vector is multiplied in block 20 by the stator flux estimate obtained from block 5 as feedback to give a direction vector $\bar{c}$ for the voltage estimate (equation 21). The resultant direction vector is multiplied in block 21 by the difference variable $\epsilon$ weighted by factor $w_u$ obtained from block 16, which gives as the output from block 21 the correction term for said voltage estimate.

The difference variable $\epsilon$ is determined by means of a scalar product in accordance with equation 12. To obtain the first factor of the scalar product, the stator current $\bar{i}_s$ is first multiplied by the stator inductance $L_s$ in block 6 and the product thus obtained is subtracted in block 8 from the stator flux estimate $\bar{\psi}_{se}$ obtained as feedback from block 5. Respectively, the other factor in said scalar product is obtained by multiplying the stator current $\bar{i}_s$ by the short circuit inductance $\sigma L_s$ in block 7 and subtracting the product thus obtained in block 9 from the stator flux estimate $\bar{\psi}_{se}$ obtained from block 5. Finally, in block 10 a scalar product is calculated from the outputs of blocks 8 and 9 to give the difference variable $\epsilon$.

The variable q is determined on the basis of equation 23 by first calculating in block 13 a cross product of the current $\bar{i}_s$ and the stator flux estimate $\bar{\psi}_{se}$ obtained as feedback from block 5, i.e. a torque estimate $T_e$ (equation 14) which is subsequently multiplied in block 14 at supply frequency $\omega_s$ to give the variable q.

In practice, the calculation method illustrated in FIG. 4 can be realized either as an analog system or as a time-discrete system based on sampling. In an analog system the stator flux estimate produced has a direct feedback effect on the inputs of blocks 20, 8, 9 and 13. In a time-discrete system the input of said blocks is in practice constituted by a previous value for the stator flux estimate. However, the selected mode of operation has no effect on the actual method and its practicability, and both modes of operation are encompassed by the scope defined in the appended claims.

I claim:

1. A method for determining an estimate for the stator flux of an asynchronous machine when the supply frequency $\omega_s$, stator inductance $L_s$, at least one of stator resistance $R_s$ and an estimate $R_{se}$ therefor, ans short-circuit inductance $\sigma L_s$ are known, comprising the steps of:

measuring the stator current $\bar{I}_s$ and stator voltage $\bar{u}_s$, calculating a difference voltage by subtracting at least one of the product of the stator resistance and the estimate thereof and the stator current from the stator voltage, integrating said difference voltage in relation to time to give a stator flux estimate $\bar{\psi}_{se}$, subtracting, prior to said step of integrating a correction term based on the feedback stator flux estimate $\bar{\psi}_{se}$ and being proportional to the product of the difference variable $\epsilon$ and the direction vector $\bar{C}$ given therefor, from said difference voltage, determining said difference variable from the equation:

$$(\bar{\psi}_{se} - L_s \bar{I}_s) \cdot (\bar{\psi}_{se} - \sigma L_s \bar{I}_s) = \epsilon \text{ and}$$

forming the direction vector $\bar{C}$ from the feedback stator flux estimate $\bar{\psi}_{se}$ by turning it for the angle $\theta$ which is dependent on the operational mode of the machine.

2. A method as claimed in claim 1, wherein when the machine serves as a motor the angle $\theta$ is 0.

3. A method as claimed in claim 1 further comprising the step of determining an estimate $R_{se}$ for the stator resistance for calculating said difference voltage and determining the stator resistance estimate $R_{se}$ by integrating the product of said difference variable $\epsilon$ and the factor $W_r$ dependent on the operational mode of the machine in relation to time.

4. A method as claimed in claim 3, wherein when the machine serves as a motor the factor $W_r$ is $W_r$, and when the machine serves as a generator the factor $W_r$ is $W_r$, where $W_r$ is a positive constant.

5. A method as claimed in claim 1, wherein when the machine serves as a generator the angle $\theta$ is a function of the supply frequency $\omega_s$.

6. A method as claimed in claim 3, wherein when the machine serves as a generator the factor $W_r$ is $(-) W_r$ where Wr is a positive constant.

7. Apparatus for determining an estimate for the stator flux of an asynchronous machine when the supply frequency $\omega_s$, stator inductance $L_s$, at least one of stator resistance $R_s$ and an estimate $R_{se}$ therefor, and short-circuit inductance $\sigma L_s$ are known, comprising:

means for measuring the stator current $\bar{I}_s$ and stator voltage $\bar{u}_s$, calculating a difference voltage by subtracting at least one of the product of the stator resistance and the estimate thereof and the stator current from the stator voltage, integrating said difference voltage in relation to time to give a stator flux estimate $\bar{\psi}_{se}$, subtracting, prior to said step of integrating a correction term based on the feedback stator flux estimate $\bar{\psi}_{se}$ and being proportional to the product of the difference variable and the direction vector $\bar{C}$ given therefor, from said difference voltage, determining said difference variable from the equation:

$$(\bar{\psi}_{se} - L_s \bar{I}_s) \cdot (\bar{\psi}_{se} - L_s \bar{I}_s) = \epsilon \text{ and}$$

forming the direction vector $\bar{C}$ from the feedback stator flux estimate $\bar{\psi}_{se}$ by turning it for the angle $\theta$ which is dependent on the operational mode of the machine.

8. Apparatus as claimed in claim 7, wherein when the machine serves as a motor the angle $\theta$ is 0.

9. Apparatus as claimed in claim 7, wherein when the machine serves as a generator the angle $\theta$ is a function of the supply frequency $\omega_s$.

10. Apparatus as claimed in claim 7 further comprising means for determining an estimate $R_{se}$ for the stator resistance for calculating said difference voltage and determining the stator resistance estimate $R_{se}$ by integrating the product of said difference variable $\epsilon$ and the factor $W_r$ dependent on the operational mode of the machine in relation to time.

* * * * *